United States Patent
Shin et al.

(10) Patent No.: US 6,680,224 B2
(45) Date of Patent: Jan. 20, 2004

(54) METHODS OF FORMING AND OPERATING FIELD EFFECT TRANSISTORS HAVING GATE AND SUB-GATE ELECTRODES

(75) Inventors: Hyung-cheol Shin, Taejon (KR); Jong-ho Lee, Cholapuk-do (KR); Sang-yeon Han, Taejon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/389,846

(22) Filed: Mar. 17, 2003

(65) Prior Publication Data

US 2003/0132466 A1 Jul. 17, 2003

Related U.S. Application Data

(62) Division of application No. 09/654,859, filed on Sep. 5, 2000, now Pat. No. 6,563,151.

(51) Int. Cl.[7] .......................................... H01L 21/8234

(52) U.S. Cl. ..................... 438/197; 438/302; 438/304; 438/289

(58) Field of Search ................................ 438/197, 199, 438/302, 299, 303, 304, 305, 306, 289; 257/407

(56) References Cited

U.S. PATENT DOCUMENTS

| | | | | |
|---|---|---|---|---|
| 5,063,172 | A | 11/1991 | Manley | 257/E29.302 |
| 5,091,763 | A | 2/1992 | Sanchez | 257/344 |
| 5,599,726 | A | * 2/1997 | Pan | 438/304 |
| 5,756,365 | A | * 5/1998 | Kakumu | 438/304 |
| 5,759,885 | A | * 6/1998 | Son | 438/230 |
| 6,187,636 | B1 | * 2/2001 | Jeong | 438/267 |
| 6,274,446 | B1 | 8/2001 | Agnello et al. | 438/304 |
| 6,348,387 | B1 | 2/2002 | Yu | 257/389 |

OTHER PUBLICATIONS

Noda et al., "Threshold Voltage Controlled 0.1–$\mu$m MOSFET Utilizing Inversion Layer as Extreme Shallow Source/Drain," IEDM, pp. 123–126, 1993.

Ono et al., "Sub–50 NM Gate Length N–MOSFETS With 10 NM Phosphorus Source and Drain Junctions," IEDM, pp 119–122, 1993.

Tiwari et al., "Straddle–Gate Transistor: Changing MOSFET Channel Length Between Off– and On–State Towards Achieving Tunneling–Defined Limit of Field–Effect," IEDM, pp 737–740, 1998.

Kawaura et al., "Transistor Operation of 30–nm GateLength EJ–MOSFETs," IEEE, Electron Device Letters, vol. 19, No. 3, pp. 74–76, Mar. 1998.

* cited by examiner

*Primary Examiner*—Tuan H. Nguyen
(74) *Attorney, Agent, or Firm*—Myers Bigel Sibley & Sajovec

(57) ABSTRACT

Field effect transistors include a semiconductor substrate having a channel region of first conductivity type therein extending adjacent a surface thereof. Source and drain regions of second conductivity type are also provided at opposite ends of the channel region. The source and drain regions extend in the semiconductor substrate and form P-N rectifying junctions with the channel region. A gate electrode extends on the channel region and comprises a first electrically conductive material having a first work function. A first sub-gate electrode extends on the channel region and comprises a second electrically conductive material having a second work function that is unequal to the first work function. The second electrically conductive material is preferably selected so that a difference between the second work function and a work function of the channel region is sufficient to form an inversion-layer in a portion of the channel region extending opposite the first sub-gate electrode when the first sub-gate electrode is at a zero potential bias relative to the channel region.

15 Claims, 3 Drawing Sheets

METHODS OF FORMING AND OPERATING FIELD EFFECT TRANSISTORS HAVING GATE AND SUB-GATE ELECTRODES

REFERENCE TO PRIORITY APPLICATION

This application is a divisional of U.S. application Ser. No. 09/654,859, filed Sep. 5, 2000, now U.S. Pat. No. 6,563,151, the disclosure of which is hereby incorporated herein by reference.

FIELD OF THE INVENTION

The present invention relates to a semiconductor device and a fabricating method thereof, and more particularly, to a submicron channel MOSFET and a fabricating method thereof.

BACKGROUND OF THE INVENTION

In general, the length of a channel must be shortened to reduce the size of a MOSFET. Hence, various approaches have been conducted to develop MOSFETs having a submicron channel. However, when a MOSFET becomes a submicron channel, that is, a short channel, the unit devices (unit MOSFETs) of a highly-integrated circuit have different distributions of impurities in a channel region, leading to a problem in which the unit devices have different threshold voltages. Also, the junction depth of a source/drain region must be thin while a MOSFET becomes a short channel.

The problem in which the unit devices of a highly-integrated circuit have different threshold voltages has been solved to some extent by adopting a double-sided gate or a back plane gate. This problem would not be solved completely as far as there are impurities in a channel region, since the difference in threshold voltage between unit devices is caused by the impurities in the channel region.

The problem in that a thin source/drain region must be formed has been solved by using a thin electrically-formed inversion layer as a source/drain region, since a thin source/drain region cannot be not formed when ion implantation is used.

FIG. 1 is a cross-sectional view of a conventional submicron channel MOSFET. To be more specific, a thin oxide film 107a and a thick oxide film 107b are formed on a P-type substrate 101 on which a source region 103 and a drain region 105 have been formed. A main gate 109 is formed on the thin oxide film 107a, and sub-gates 111 are formed on the thick oxide film 107b. In the conventional submicron channel MOSFET using the main gate 109 and the sub-gates 111 as described above, inversion layers 113 are formed under the sub-gates 111 by applying voltage to the main gate 109 and the sub-gates 111, and the formed inversion layers 113 are used as a thin source/drain.

However, the conventional submicron channel MOSFET of FIG. 1 has a problem associated with a process, in that a special pad must be made to apply voltage to the sub-gates 111.

Also, in the conventional extra-small channel MOSFET of FIG. 1, a high voltage must be applied to the sub-gates to form inversion layers 113, that is, the thin source and drain.

SUMMARY OF THE INVENTION

An object of the present invention is to provide a submicron channel metal oxide semiconductor field effect transistor (MOSFET) in which a thin source/drain region can be formed under sub-gates without formation of a special pad, and by which non-uniformity of threshold voltage between the unit devices of a highly-integrated circuit can be solved.

Another object of the present invention is to provide a method of fabricating the submicron channel MOSFET.

The first object of the present invention is achieved by a submicron channel metal oxide semiconductor field effect transistor (MOSFET) according to an embodiment of the present invention, wherein $N^+$ source/drain regions are formed near the surface of a $P^-$ silicon substrate, having a channel therebetween, a gate dielectric film is formed on the channel, a main gate is formed on the gate dielectric film on the channel, and sub-gates having a smaller work function than the main gate are formed on the gate dielectric film and on the sidewalls of the main gate covered with a dielectric film.

The main gate can be formed of $P^+$ polycrystalline silicon, and the sub-gates can be formed of $N^+$ polycrystalline silicon. The main gate can be formed of SiGe or a metal having a work function that is smaller than that of $P^+$ polycrystalline silicon and greater than that of $N^+$ polycrystalline silicon, and the sub-gates can be formed of $N^+$ polycrystalline silicon. The sub-gates can be formed of a conductive material having a work function that is equal to or smaller than that of $N^+$ polycrystalline silicon, and the main gate can be formed of $P^+$ polycrystalline silicon.

In the submicron channel MOSFET of the present invention as described above, there is a difference in work function between a main gate and sub-gates, and the main gate is formed of $P^+$ polycrystalline silicon on a $P^-$ substrate, so that the concentration of impurities for controlling a threshold voltage implanted into a channel region under the main gate can be reduced as much as possible. This leads to a minimization of the difference in threshold voltage between the unit devices of a highly-integrated circuit due to the non-uniformity of the impurities for controlling a threshold voltage.

Also, in the submicron channel MOSFET of the present invention, thin inversion layers used as source/drain regions under the sub-gates are formed because of the difference in work function between the main gate and the sub-gates. Furthermore, in the submicron channel MOSFET of the present invention, the sub-gates are formed of $N^+$ polycrystalline silicon, and a $P^-$ silicon substrate having a low concentration is used, so that thin inversion layers are formed under the sub-gates. Hence, voltage does not need to be applied to the sub-gates, so that a special metal pad does not need to be formed.

The submicron channel MOSFET described above denotes an N-MOSFET. However, the contents described above can be applied to P-MOSFETs.

In a submicron channel MOSFET according to another embodiment of the present invention to achieve the first object of the present invention, $P^+$ source/drain regions are formed near the surface of an $N^-$ silicon substrate, having a channel therebetween. A gate dielectric film is formed on the channel, and a main gate is formed on the gate dielectric film on the channel. Sub-gates having a greater work function than the main gate are formed on the gate dielectric film and on the sidewalls of the main gate covered with a dielectric film. Here, inversion layers formed under the sub-gates act as thin source/drain regions.

The main gate can be formed of $N^+$ polycrystalline silicon, and the sub-gates can be formed of $P^+$ polycrystalline silicon. The main gate can be formed of SiGe or a metal having a work function that is smaller than that of $P^+$ polycrystalline silicon and greater than that of $N^+$ polycrystalline silicon, and the sub-gates can be formed of P$^+$ polycrystalline silicon. The sub-gates can be formed of a conductive material having a work function that is equal to or smaller than that of P$^+$ polycrystalline silicon, and the main gate can be formed of N$^+$ polycrystalline silicon.

The second object of the present invention is achieved by a method of fabricating a submicron channel MOSFET, wherein a gate dielectric film is formed on a P$^-$ silicon substrate, a main gate is formed on the gate dielectric film, a dielectric film is formed to surround the main gate, sub-gates having a smaller work function than the main gate are formed on the dielectric film on the sidewalls of the main gate, and N$^+$ source/drain regions are formed by implanting N-type impurities into the entire surface of the P$^-$ silicon substrate on which the main gate, the dielectric film and the sub-gates are formed. Here, inversion layers formed under the sub-gates act as thin source/drain regions.

The main gate can be formed of P$^+$ polycrystalline silicon, and the sub-gates can be formed of N$^+$ polycrystalline silicon. After the sub-gates are formed, a P$^0$ region can be formed near the N$^+$ source/drain regions under the sub-gates by tilt ion implanting P-type impurities toward the sidewalls of the sub-gates. Before the gate dielectric film is formed, a P$^0$ region having a higher doping concentration than the P$^-$ silicon substrate can be formed within the P$^-$ silicon substrate.

The second object of the present invention is also achieved by a method of fabricating a submicron channel MOSFET, wherein a gate dielectric film is formed on an N$^-$ silicon substrate, a main gate is formed on the gate dielectric film, a dielectric film is formed to surround the main gate, sub-gates having a greater work function than the main gate are formed on the dielectric film on the sidewalls of the main gate, and P$^+$ source/drain regions are formed by implanting P-type impurities into the entire surface of the N$^-$ silicon substrate on which the main gate, the dielectric film and the sub-gates are formed. Here, inversion layers formed under the sub-gates act as thin source/drain regions.

Before the gate dielectric film is formed, an N$^0$ region having a higher doping concentration than the N$^-$ silicon substrate can be formed within the N$^-$ silicon substrate. The main gate can be formed of N$^+$ polycrystalline silicon, and the sub-gates can be formed of P$^+$ polycrystalline silicon. After the sub-gates are formed, an N$^0$ region can be formed near the P$^+$ source/drain regions under the sub-gates by tilt ion implanting N-type impurities toward the sidewalls of the sub-gates.

BRIEF DESCRIPTION OF THE DRAWINGS

The above objects and advantages of the present invention will become more apparent by describing in detail preferred embodiments thereof with reference to the attached drawings in which.

DESCRIPTION OF PREFERRED EMBODIMENTS

Figure 1:
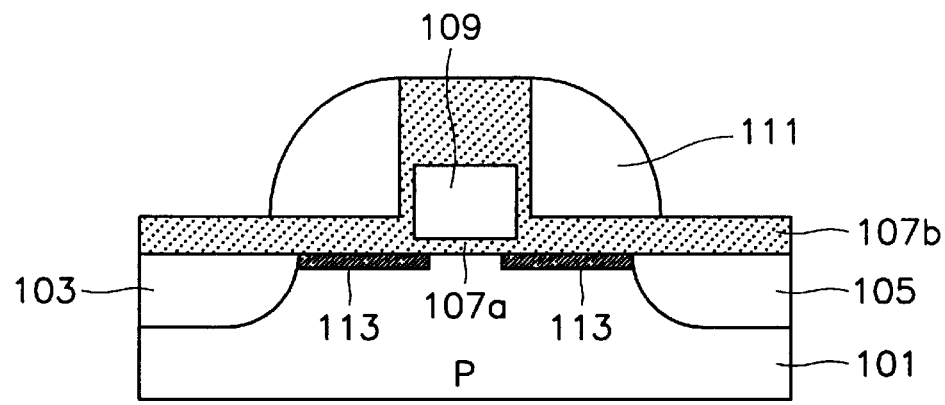
FIG. 1 is a cross-sectional view of a conventional submicron channel metal oxide semiconductor field effect transistor (MOSFET)

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Moreover, the terms "first conductivity type" and "second conductivity type" refer to opposite conductivity types such as N or P-type, however, each embodiment described and illustrated herein includes its complementary embodiment as well. Like numbers refer to like elements throughout.

Figure 2:
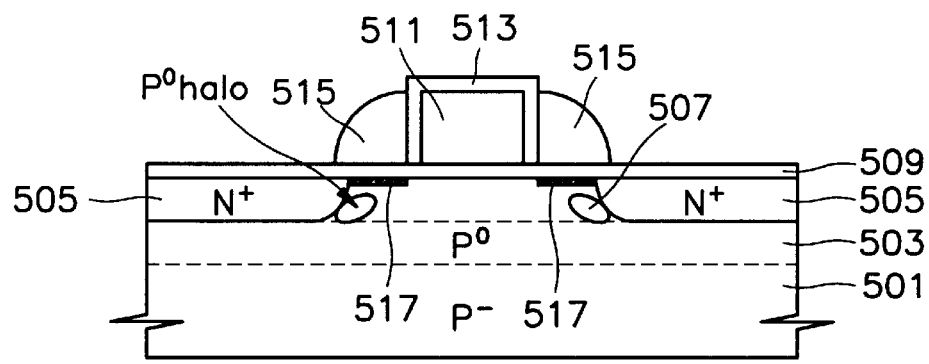
FIG. 2 is a cross-sectional view of a submicron channel MOSFET according to a first embodiment of the present invention.

A submicron channel MOSFET according to a first embodiment of the present invention shown in FIG. 2 is an N-MOSFET. To be more specific, a P$^0$ region 503 is formed on a P$^-$ silicon substrate 501 to have a higher doping concentration than the P$^-$ silicon substrate 501. The P$^0$ region 503 is formed to prevent a short channel effect by improving drain induced barrier lowering (DIBL).

N$^+$ source/drain regions 505 are formed near the surface of the P$^-$ silicon substrate 501, and a P$^0$ halo ion implantation region 507 is formed below one side of each of the N$^+$ source/drain regions 505. The P$^0$ halo ion implantation region 507 is formed to suppress punch through between the two N$^+$ source/drain regions 505.

A gate dielectric film 509, for example, a silicon oxide film, is formed on the entire surface of the P$^-$ silicon substrate 501 on which the N$^+$ source/drain regions 505 are formed. A main gate 511 is formed on the gate dielectric film 509 between the N$^+$ source/drain regions 505. A thin dielectric film 513, for example, a silicon oxide film, which covers the main gate 511, is formed on the gate dielectric film 509 to a thickness of 600 Å. Sub-gates 515 having a smaller work function than the main gate 511 are formed in spacer shapes on the thin dielectric film 513 on the sidewalls of the main gate 511. The main gate 511 can be formed of P$^+$ polycrystalline silicon, and the sub-gates 515 can be formed of N$^+$ polycrystalline silicon.

In the submicron channel N-MOSFET of the present invention having such a structure, there is a difference in a work function between the main gate 511 and the sub-gates 515, and the main gate 511 is formed of P$^+$ polycrystalline silicon on the P$^-$ substrate 501, so that the concentration of impurities for controlling a threshold voltage implanted into a channel region under the main gate 511 can be reduced as much as possible. The reduction of the concentration of impurities for controlling a threshold voltage implanted into a channel region can increase the mobility of a carrier and can minimize a change in the threshold voltage between the unit devices of a highly-integrated circuit due to the non-uniformity of the impurities for controlling a threshold voltage. The main gate 511 can be formed of P$^+$ polycrystalline silicon in this embodiment, but can be formed of silicon germanium (SiGe) or a metal having a work function that is smaller than that of $P^+$ polycrystalline silicon and greater than that of $N^+$ polycrystalline silicon, for example, Ag or Au.

Also, in the submicron channel N-MOSFET of the present invention, the main gate 511 and the sub-gates 515 have different work functions, so that the threshold voltage under the main gate 511 is different from the threshold voltage under the sub-gates 515. Because of the difference in work function between the main gate 511 and the sub-gates 515, the thin inversion layers 517 formed under the sub-gates 515 are used as a source/drain region.

Furthermore, in the submicron channel N-MOSFET of the present invention, the sub-gate 515 is formed of $N^+$ polycrystalline silicon, and the $P^-$ silicon substrate 501 having a low concentration is used, so that thin inversion layers 517 are formed under the sub-gates 515. Accordingly, voltage does not need to be applied to the sub-gates 515, so that the sub-gates 515 can be formed by a general sidewall process without the formation of a special metal pad.

Also, when voltage is applied to the main gate 511, the sub-gates 515 are floated, and thus the electrostatic potential of the sub-gates 515 (floating gates) is increased due to electrostatic capacity coupling, resulting in the smooth formation of the thin inversion layers 517. The thin inversion layers 517 smoothly formed in this way can be used as source drain regions. The sub-gates 515 are formed of $N^+$ polycrystalline silicon in this embodiment, but can be formed of a conductive material having a work function that is equal to or smaller than that of $N^+$ polycrystalline silicon.

Also, in the submicron channel MOSFET of the present invention, the thin dielectric film 513 is provided between the main gate 511 and the sub-gates 515 to distinguish between the two gates, so that the main gate 511 and the sub-gates 515 can be formed of various materials.

Also, the resistance under the sub-gates 515 can be reduced by forming an N region (not shown), that is too thin to affect DIBL, under the sub-gates 515.

Figure 3:
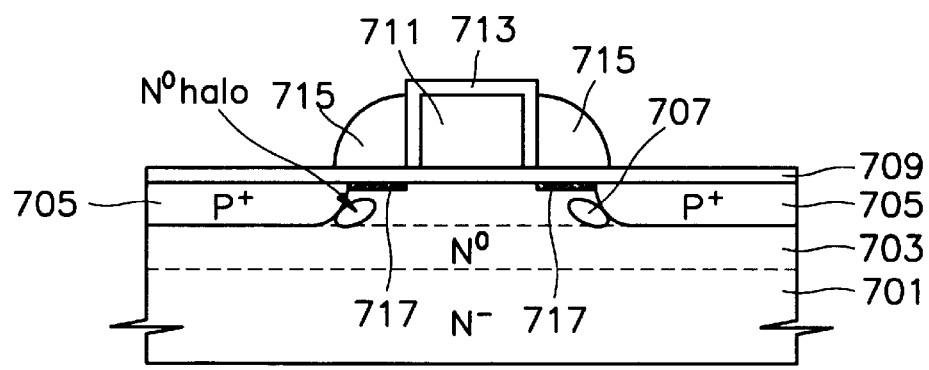
FIG. 3 is a cross-sectional view of a submicron channel MOSFET according to a second embodiment of the present invention.

FIG. 3 is a cross-sectional view of a submicron channel MOSFET according to a second embodiment of the present invention. The submicron channel MOSFET of FIG. 3 is a P-MOSFET.

To be more specific, an $N^0$ region 703 is formed on an $N^-$ silicon substrate 701 to have a higher doping concentration than the $N^-$ silicon substrate 701. The $N^0$ region 703 is formed to prevent a short channel effect by improving DIBL. $P^+$ source/drain regions 705 are formed near the surface of the $N^-$ silicon substrate 701, and an $N^0$ halo ion implantation region 707 is formed below one side of each of the $P^+$ source/drain regions 705. The $N^0$ halo ion implantation region 707 is formed to suppress punch through between the two $P^+$ source/drain regions 705.

A gate dielectric film 709 is formed on the entire surface of the $N^-$ silicon substrate 701 on which the $P^+$ source/drain regions 705 are formed. A main gate 711 is formed on the gate dielectric film 709, for example, a silicon oxide film, between the $P^+$ source/drain regions 705. A thin dielectric film 713, for example, a silicon oxide film, which covers the main gate 711, is formed on the gate dielectric film 709 to a thickness of 600 Å.

In contrast to FIG. 2, sub-gates 715 having a greater work function than the main gate 711 are formed in spacer shapes on the thin dielectric film 713 on the sidewalls of the main gate 711, in order to manufacture the P-channel MOSFET. The main gate 711 can be formed of $N^+$ polycrystalline silicon, and the sub-gates 715 can be formed of $P^+$ polycrystalline silicon.

In the submicron channel P-MOSFET of the present invention having such a structure, there is a difference in a work function between the main gate 711 and the sub-gates 715, and the main gate 711 can be formed of $N^+$ polycrystalline silicon on the $N^-$ substrate 701, so that the concentration of impurities for controlling a threshold voltage implanted into a channel region under the main gate 711 can be reduced as much as possible. The reduction of the concentration of impurities for controlling a threshold voltage implanted into a channel region can increase the mobility of a carrier and can minimize a change in the threshold voltage between the unit devices of a highly-integrated circuit due to the non-uniformity of the impurities for controlling a threshold voltage. The main gate 711 can be formed of $N^+$ polycrystalline silicon in this embodiment, but can be formed of silicon germanium (SiGe) or a metal having an work function that is smaller than that of $P^+$ polycrystalline silicon and greater than that of $N^+$ polycrystalline silicon, for example, Al or Mg.

Also, in the submicron channel P-MOSFET of the present invention, the main gate 711 and the sub-gates 715 have different work functions, so that the threshold voltage under the main gate 711 is different from the threshold voltage under the sub-gates 715. Because of the difference in work function between the main gate 711 and the sub-gates 715, the thin inversion layers 717 formed under the sub-gates 715 are used as a source/drain region.

Furthermore, in the submicron channel P-MOSFET of the present invention, the sub-gate 715 is formed of $P^+$ polycrystalline silicon, and the $N^-$ silicon substrate 701 having a low concentration is used, so that the thin inversion layers 717 are formed under the sub-gates 715. Accordingly, voltage does not need to be applied to the sub-gates 715, so that the sub-gates 715 can be formed by a general sidewall process without the formation of a special metal pad.

Also, when voltage is applied to the main gate 711, the sub-gates 715 are floated, and thus the electrostatic potential of the sub-gates 715 (floating gates) is increased due to electrostatic capacity coupling, resulting in the smooth formation of the thin inversion layers 717. The thin inversion layers 717 smoothly formed in this way can be used as source/drain regions. The sub-gates 715 are formed of $P^+$ polycrystalline silicon in this embodiment, but can be formed of a conductive material having a work function that is equal to or smaller than that of $P^+$ polycrystalline silicon.

Also, in the submicron channel MOSFET of the present invention, the thin dielectric film 713 is provided between the main gate 711 and the sub-gates 715 to distinguish between the two gates, so that the main gate 711 and the sub-gates 715 can be formed of various materials.

Also, the resistance under the sub-gates 715 can be reduced by forming a P region (not shown), that is too thin to affect DIBL, under the sub-gates.

In a process for fabricating a conventional P-MOSFET, boron ions are implanted to adjust a threshold voltage to a desired value, leading to easy occurrence of punch through in the P-MOSFET. However, in the P-MOSFET of the present invention, additional ion implantation for adjusting a threshold voltage is not required since a low concentration substrate is used, so that punch through is prevented.

Figure 4:
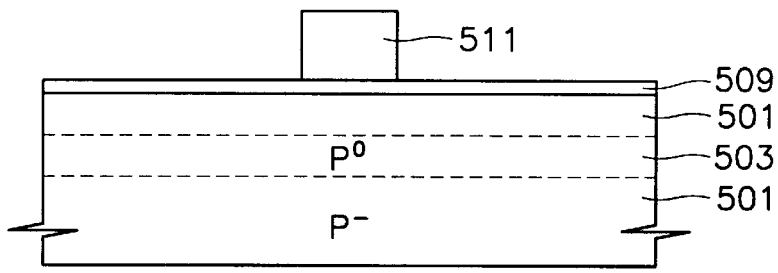
FIGS. 4 through 7 are cross-sectional views illustrating a method of fabricating the submicron channel MOSFET of FIG. 2.

FIGS. 4 through 7 are cross-sectional views illustrating a method of fabricating the submicron channel MOSFET of FIG. 2. Referring to FIG. 4, a $P^0$ region 503 having a higher doping concentration than a $P^-$ silicon substrate 501 is formed on the $P^-$ silicon substrate 501 to suppress a short channel effect by improving DIBL. A gate dielectric film 509 is formed on the P⁻ silicon substrate 501. Then, a main gate 511 is formed of P⁺ polycrystalline silicon to a thickness of 1100 Å on the gate dielectric film 509 by a photo-etching process. P⁺ polycrystalline silicon forming the main gate 511 is formed by forming a polycrystalline silicon film on the P⁻ silicon substrate 501 and then implanting boron at a $1.0 \times 10^{15}$ cm⁻² dose with 10 KeV energy. Since the main gate 511 is formed of P⁺ polycrystalline silicon and the P⁻ silicon substrate 501 is used, channel doping can be reduced as much as possible, and thus the mobility of a carrier can be significantly increased. The main gate 511 can be formed of SiGe or a metal having a work function that is smaller than that of P⁺ polycrystalline silicon and greater than that of N⁺ polycrystalline silicon, for example, Ag or Au.

Figure 5:
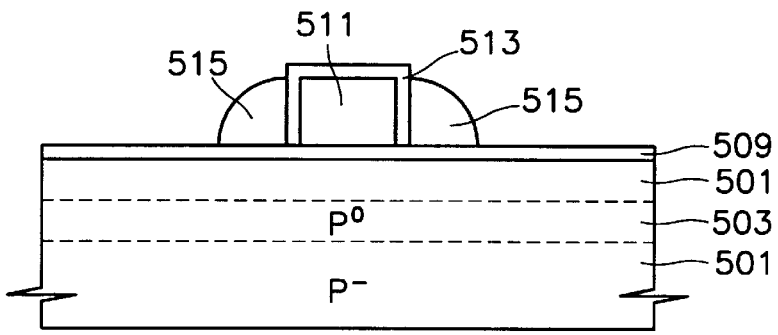

Referring to FIG. 5, a thin dielectric film 513, for example, a silicon oxide film, which surrounds the main gate 511, is formed to a thickness of 600 Å. Then, sub-gates 515 are formed of N⁺ polycrystalline silicon having a smaller work function than the main gate 511, on the sidewalls of thin dielectric film 513. The sub-gates 515 are formed to a thickness of 500 to 1500 Å. N⁺ polycrystalline silicon forming the sub-gates 515 is formed by implanting a $1.0 \times 10^{15}$ cm⁻² dose of arsenic (As) with 10 KeV energy into a polycrystalline silicon film. The sub-gates 515 and the main gate 511 have different work functions, so that the threshold voltage under the sub-gates 515 is different from that under the main gate 511.

In particular, since the sub-gates 515 are formed of N⁺ polycrystalline silicon, and a P⁻ silicon substrate having a low concentration is used, inversion layers are formed under the sub-gates 515. Accordingly, the inversion layers are formed without applying voltage to the sub-gates 515, so that the sub-gates 515 can be formed by an existing sidewall process without formation of a special metal pad.

When voltage is applied to the main gate 511, the sub-gates 515 are floated, and thus the electrostatic potential of the floating gates is increased due to electrostatic capacity coupling, leading to smoother formation of inversion layers. The sub-gates 515 can be formed of a conductive material having a work function that is equal to or smaller than that of N⁺ polycrystalline silicon.

Figure 6:
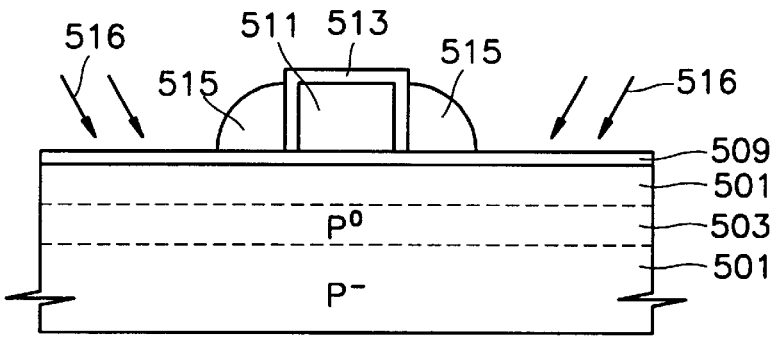

Referring to FIG. 6, P-type impurities 516 are tilt ion implanted into the sidewalls of the sub-gates 515 to form the P⁰ halo ion regions 507 (FIG. 2) under the sub-gates 515. The P⁰ halo ion implantation is performed to prevent a short channel effect by improving the punch through characteristics.

Figure 7:
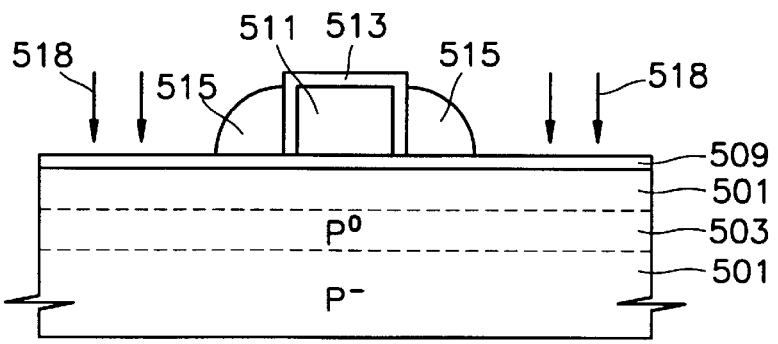

Referring to FIG. 7, N-type impurities, for example, arsenic (As), are implanted at a $1 \times 10^{20}$ cm⁻² dose on the entire surface of the P⁻ silicon substrate 501 on which the main gate 511, the thin dielectric film 513 and the sub-gates 515 are formed. Continuously, the P⁰ halo ion regions 507 (FIG. 2) and the N⁺ source/drain regions 505 (FIG. 2) are formed through thermal treatment, thereby completing the formation of the N-MOSFET.

Figure 8:
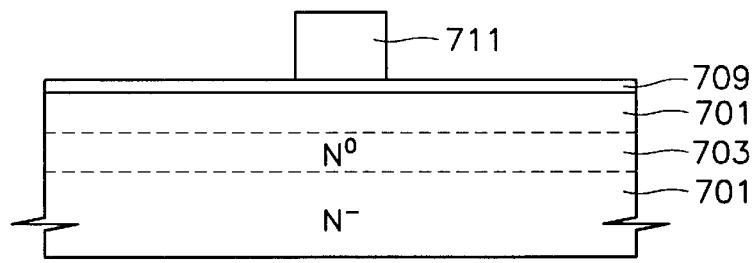
FIGS. 8 through 11 are cross-sectional views illustrating a method of fabricating the submicron channel MOSFET of FIG. 3.

FIGS. 8 through 11 are cross-sectional views illustrating a method of fabricating the submicron channel MOSFET of FIG. 3. Referring to FIG. 8, an N⁰ region 703 having a higher doping concentration than an N-type substrate 701 is formed on the N⁻ silicon substrate 701 to suppress a short channel effect by improving DIBL. A gate dielectric film 709 is formed on the N-type substrate 701. Then, a main gate 711 is formed of N⁺ polycrystalline silicon to a thickness of 1100 Å on the gate dielectric film 709 by a photo-etching process. N⁺ polycrystalline silicon forming the main gate 711 is formed by forming a polycrystalline silicon film on the N⁻ silicon substrate 701 and then implanting arsenic into the polycrystalline silicon film at a $1.0 \times 10^{15}$ cm⁻² dose with 5 KeV energy. Since the N⁻ silicon substrate 701 is used, and the main gate 711 is formed of N⁺ polycrystalline silicon, channel doping can be reduced as much as possible, and thus the mobility of a carrier can be significantly increased. The main gate 711 can be formed of SiGe or a metal having a work function that is smaller than that of P⁺ polycrystalline silicon and greater than that of N⁺ polycrystalline silicon, for example, Al or Mg.

Figure 9:
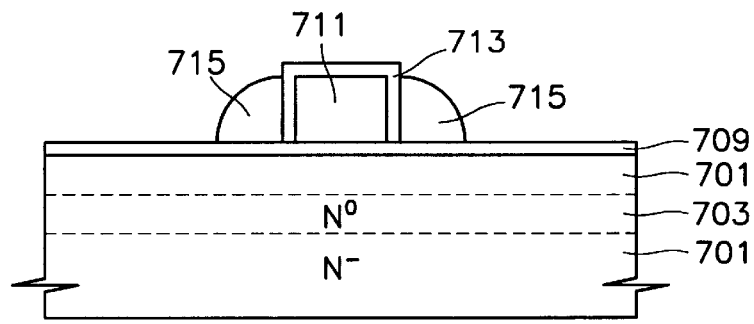

Referring to FIG. 9, a thin dielectric film 713, for example, a silicon oxide film, which surrounds the main gate 711, is formed to a thickness of 600 Å. Then, sub-gates 715 are formed of P⁺ polycrystalline silicon having a greater work function than the main gate 711, on the sidewalls of the thin dielectric film 713. The sub-gates 715 are formed to a thickness of 500 to 1500 Å. P⁺ polycrystalline silicon forming the sub-gates 715 is formed by implanting a $1.0 \times 10^{15}$ cm⁻² dose of boron (B) into a polycrystalline silicon film with 10 KeV energy. The sub-gates 715 and the main gate 711 have different work functions, so that the threshold voltage under the sub-gates 715 is different from that under the main gate 711.

In particular, since the sub-gates 715 are formed of P⁺ polycrystalline silicon, and an N⁻ silicon substrate having a low concentration is used, inversion layers are formed under the sub-gates 715. Accordingly, the inversion layers are formed without applying voltage to the sub-gates 715, so that the sub-gates 715 can be formed by an existing sidewall process without formation of a special metal pad.

When voltage is applied to the main gate 711, the sub-gates 715 are floated, and thus the electrostatic potential of the floating gates is increased due to electrostatic capacity coupling, leading to smoother formation of inversion layers. The sub-gates 715 can be formed of a conductive material having a work function that is equal to or greater than that of P⁺ polycrystalline silicon.

Figure 10:
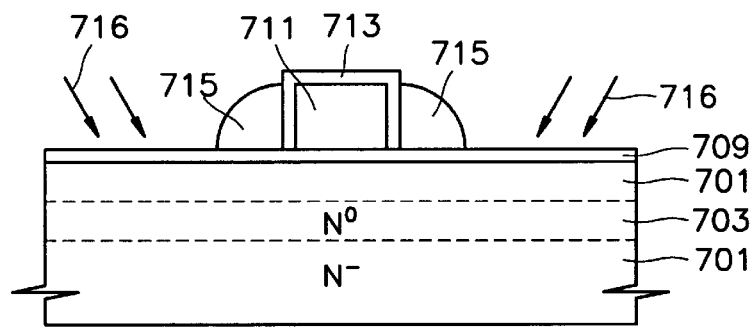

Referring to FIG. 10, N-type impurities 716 are tilt ion implanted into the sidewalls of the sub-gates 715 to form the P⁰ halo ion regions 707 (FIG. 3) under the sub-gates 715. The P⁰ halo ion implantation is performed to prevent a short channel effect by improving the punch through characteristics.

Figure 11:
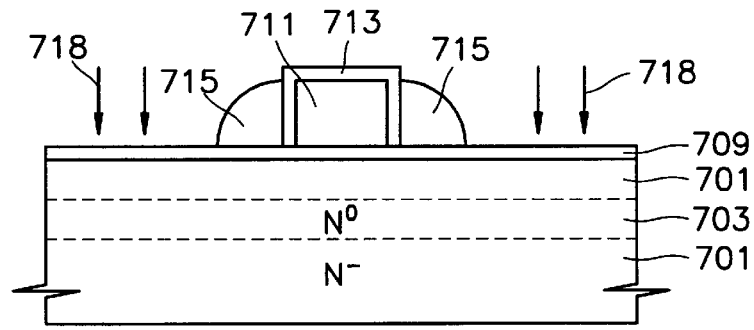

Referring to FIG. 11, P-type impurities, for example, boron, are implanted into the entire surface of the N⁻ silicon substrate 701 on which the main gate 711, the thin dielectric film 713 and the sub-gates 715 are formed. Continuously, the P⁰ halo ion regions 707 (FIG. 3) and the P⁺ source/drain regions 705 (FIG. 3) are formed through thermal treatment, thereby completing the formation of the P-MOSFET.

In an submicron channel MOSFET of the present invention as described above, the mobility of a carrier can be increased by reducing the concentration of impurities for controlling a threshold voltage as much as possible, and can minimize a change in threshold voltage due to the non-uniformity of the impurities for controlling a threshold voltage.

Also, the submicron channel MOSFET of the present invention includes a main gate and sub-gates and uses inversion layers formed under the sub-gates as a thin source/drain region, thus reducing a short channel effect. Furthermore, in the submicron channel MOSFET of the present invention, the inversion layers can be formed more smoothly because of electrostatic capacity coupling without separate application of voltage to the sub-gates.

Also, in the submicron channel MOSFET of the present invention, a thin dielectric film is provided between the main gate and the sub-gates to distinguish between the two gates, so that the main gate and the sub-gates can be formed of various materials.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of fabricating a submicron channel MOSFET, comprising:

forming a $P^0$ region having a higher doping concentration than a $P^-$ silicon substrate within the $P^-$ silicon substrate and then forming a gate dielectric film on the $P^-$ silicon substrate;

forming a main gate on the gate dielectric film;

forming a dielectric film to surround the main gate;

forming sub-gates having a smaller work function than the main gate, on the dielectric film on the sidewalls of the main gate; and forming $N^+$ source/drain regions by implanting N-type impurities into the entire surface of the $P^-$ silicon substrate on which the main gate, the dielectric film and the sub-gates are formed, wherein inversion layers formed under the sub-gates act as thin source/drain regions.

2. The method of claim 1, wherein the main gate is formed of $P^+$ polycrystalline silicon.

3. The method of claim 1, wherein the sub-gates are formed of $N^+$ polycrystalline silicon.

4. The method of claim 1, wherein the main gate is formed of $p^+$ polycrystalline silicon, and the sub-gates are formed of $N^+$ polycrystalline silicon.

5. The method of claim 1, wherein the main gate is formed of SiGe or a metal having a work function that is smaller than that of $P^+$ polycrystalline silicon and greater than that of $N^+$ polycrystalline silicon, and the sub-gates are formed of $N^+$ polycrystalline silicon.

6. The method of claim 1, wherein the sub-gates are formed of a conductive material having a work function that is equal to or smaller than that of $N^+$ polycrystalline silicon, and the main gate is formed of $P^+$ polycrystalline silicon.

7. A method of fabricating a submicron channel MOSFET, comprising:

forming a gate dielectric film on a $P^-$ silicon substrate;

forming a main gate on the gate dielectric film;

forming a dielectric film to surround the main gate;

forming sub-gates having a smaller work function than the main gate, on the dielectric film cn the sidewalls of the main gate;

forming $N^+$ source/drain regions by implanting N-type impurities into the entire surface of the $P^-$ silicon substrate on which the main gate, the dielectric film and the sub-gates are formed; and forming a $P^0$ region near the $N^+$ source/drain regions under the sub-gates by tilt ion implanting P-type impurities toward the sidewalls of the sub-gates, after the sub-gates are formed, wherein inversion layers formed under the sub-gates act as thin source/drain regions.

8. A method of fabricating a submicron channel MOSFET, comprising:

forming an $N^0$ region having a higher doping concentration than an $N^-$ silicon substrate within the $N^-$ silicon substrate and then forming a gate dielectric film on the $N^-$ silicon substrate;

forming a main gate on the gate dielectric film;

forming a dielectric film to surround the main gate;

forming sub-gates having a greater work function than the main gate, on the dielectric film on the sidewalls of the main gate; and forming $P^+$ source/drain regions by implanting P-type impurities into the entire surface of the $N^-$ silicon substrate on which the main gate, the dielectric film and the sub-gates are formed, wherein inversion layers formed under the sub-gates act as thin source/drain regions.

9. The method of claim 8, wherein the main gate is formed of $N^+$ polycrystalline silicon.

10. The method of claim 8, wherein the sub-gates are formed of $P^+$ polycrystalline silicon.

11. The method of claim 8, wherein the main gate is formed of $N^+$ polycrystalline silicon, and the sub-gates are formed of $P^+$ polycrystalline silicon.

12. The method of claim 8, wherein the main gate is formed of SiGe or a metal having a work function that is smaller than that of $P^+$ polycrystalline silicon and greater than that of $N^+$ polycrystalline silicon, and the sub-gates are formed of $P^+$ polycrystalline silicon.

13. The method of claim 8, wherein the sub-gates are formed of a conductive material having a work function that is equal to or smaller than that of $P^+$ polycrystalline silicon, and the main gate is formed of $N^+$ polycrystalline silicon.

14. A method of fabricating a submicron channel MOSFET, comprising:

forming a gate dielectric film on an $N^-$ silicon substrate;

forming a main gate on the gate dielectric film;

forming a dielectric film to surround the main gate;

forming sub-gates having a greater work function than the main gate, on the dielectric film on the sidewalls of the main gate; and forming $p^+$ source/drain regions by implanting P-type impurities into the entire surface of the $N^-$ silicon substrate on which the main gate, the dielectric film and the sub-gates are formed;

forming an $N^0$ region near the $P^+$ source/drain regions under the sub-gates by tilt ion implanting N-type impurities toward the sidewalls of the sub-gates, after the sub-gates are formed, wherein inversion layers formed under the sub-gates act as thin source/drain regions.

15. A method of operating a field effect transistor comprising a semiconductor substrate having a channel region of first conductivity type therein that extends adjacent a surface thereof, source and drain regions of second conductivity type that extend in the semiconductor substrate and form P-N rectifying junctions with the channel region, a gate electrode that extends on the channel region and comprises a first electrically conductive material having a first work function, a first sub-gate electrode that extends on a source-side of the channel region and comprises a second electrically conductive material having a second work function that is unequal to the first work function and a second sub-gate electrode that extends on a drain-side of the channel region and comprises the second electrically conductive material, said method comprising the step of:

turning-on the field effect transistor by applying a gate voltage of sufficient magnitude to the gate electrode to thereby form an inversion layer channel in the channel region while simultaneously floating the first and second sub-gate electrodes.

* * * * *